(12) United States Patent
Takahashi

(10) Patent No.: US 8,391,071 B2
(45) Date of Patent: Mar. 5, 2013

(54) READOUT CIRCUIT AND SEMICONDUCTOR STORAGE DEVICE

(75) Inventor: Toru Takahashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 13/050,060

(22) Filed: Mar. 17, 2011

(65) Prior Publication Data

US 2012/0106258 A1    May 3, 2012

(30) Foreign Application Priority Data

Oct. 27, 2010    (JP) ................... 2010-241240

(51) Int. Cl.
  *G11C 16/28*    (2006.01)
(52) U.S. Cl. ............. 365/185.21; 365/189.07; 365/207; 365/210.1
(58) Field of Classification Search ............. 365/185.21, 365/189.07, 207, 210.1
   See application file for complete search history.

(56) References Cited

U.S. PATENT DOCUMENTS

| 5,410,511 | A | 4/1995 | Michiyama |
| 2002/0015345 | A1* | 2/2002 | Fournel ...................... 365/207 |
| 2007/0147112 | A1 | 6/2007 | Edahiro et al. |
| 2007/0280021 | A1 | 12/2007 | Ueda et al. |

FOREIGN PATENT DOCUMENTS

| JP | 06-251593 | 9/1994 |
| JP | 07-235189 | 9/1995 |

* cited by examiner

*Primary Examiner* — Hoai V Ho
*Assistant Examiner* — Jay Radke
(74) *Attorney, Agent, or Firm* — Turocy & Watson, LLP

(57) ABSTRACT

A readout circuit has a sense amplifier to compare a cell current which changes according to whether a memory cell is on or off to a reference current to output a comparison signal of a first logic value upon detecting that the cell current is smaller than the reference current, and to output a comparison signal of a second logic value upon detecting that the cell current is greater than the reference current, the readout circuit outputting a data output signal depending upon an output of the sense amplifier. The reference current is set to be greater than a middle value between a first cell current, which flows when the memory cell is in an off-state, and a second cell current, which flows when the memory cell is in an on-state, the reference current is greater than the first cell current and is smaller than the second cell current. The sense amplifier outputs the comparison signal of the second logic value unless the sense amplifier detects that the cell current is smaller than the reference current as a result of a comparison made between the cell current and the reference current, wherein the sense amplifier outputs the comparison signal of the second logic value regardless of whether the sense amplifier detects that the cell current is greater than the reference current.

20 Claims, 5 Drawing Sheets

READOUT CIRCUIT AND SEMICONDUCTOR STORAGE DEVICE

CROSS-REFERENCE TO RELATED APPLICATION

This application is based upon and claims the benefit of priority from the prior Japanese Patent Application No. 2010-241240, filed on Oct. 27, 2010, the entire contents of which are incorporated herein by reference.

BACKGROUND

1. Field

Embodiments described herein relate generally to a readout circuit for sensing a cell current which flows through a memory cell, and a semiconductor storage device.

2. Background Art

A readout circuit in a conventional semiconductor storage device such as a flash memory includes, for example, a sense amplifier, which compares a cell current to a reference current, and outputs data "1" when the cell current is greater than the reference current and which outputs data "0" when the cell current is smaller than the reference current, for example.

The sense amplifier needs time for comparing the cell current to the reference current, and a comparison decision time required for data "1" is approximately equal to that required for data "0."

In recent years, the cell current of the memory cell has become small (several tens of μA or less, or in the nA order in some cases) as the size of the memory cell shrinks. Therefore, the reference current used to read out data from the memory cell also needs to be a small current (a current which is at least smaller than a cell current of a memory cell in the on-state and greater than a cell current of a memory cell in the off-state).

If dispersion of the reference current becomes great, then designing the readout circuit (sense amplifier) becomes very difficult. And if the margin of the readout operation is insufficient, the readout circuit may conduct erroneous readout.

Dispersion or variation of the reference current is observed with dispersion of characteristics of the MOS transistor generating a constant current, which becomes the reference current. Therefore, a circuit design which takes into consideration or compensates for this dispersion is demanded.

Conventionally, an ideal value of the reference current is set to a middle value between a cell current in the on-state of the memory cell and a cell current in the off-state thereof.

Since the cell current in the on-state of the memory cell is small as described above, however, it is difficult to secure the margin of the readout operation of the sense amplifier.

DETAILED DESCRIPTION

A readout circuit according to an embodiment comprises a sense amplifier configured to compare a cell current, which changes according to whether a memory cell is on or off, to a reference current, to output a comparison signal of a first logic value upon detecting that the cell current is smaller than the reference current, and to output a comparison signal of a second logic value upon detecting that the cell current is greater than the reference current, the readout circuit The reference current is set to be greater than a middle value between a first cell current, which flows when the memory cell is in an off-state, and a second cell current, which flows when the memory cell is in an on-state, the reference current is greater than the first cell current and is smaller than the second cell current.

The sense amplifier outputs the comparison signal of the second logic value unless the sense amplifier detects that the cell current is smaller than the reference current as a result of a comparison made between the cell current and the reference current, wherein the sense amplifier outputs the comparison signal of the second logic value regardless of whether the sense amplifier detects that the cell current is greater than the reference current.

Hereafter, a readout circuit according to the present invention will be described more specifically with reference to the drawings.

First Embodiment

Figure 1:
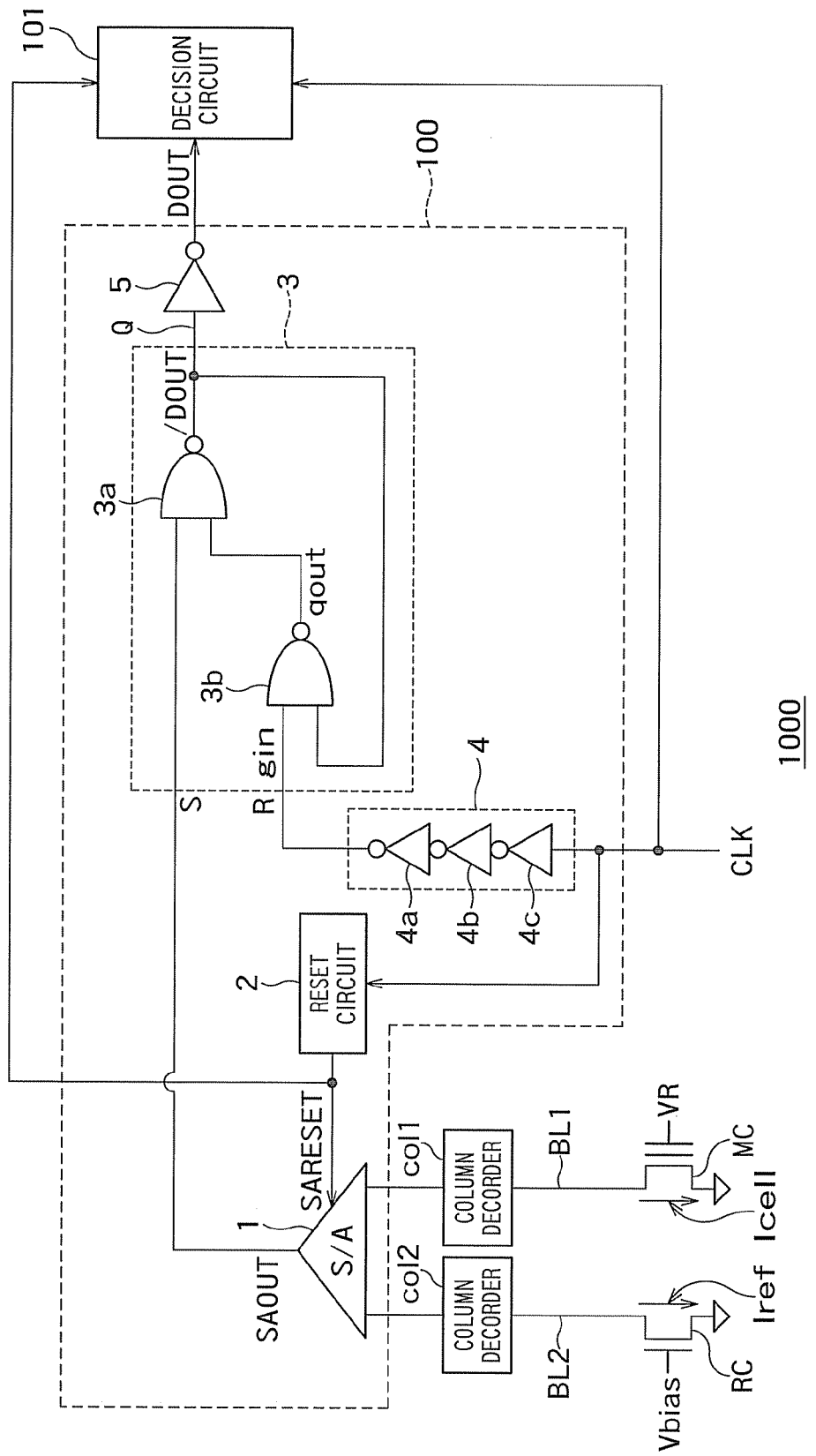
FIG. 1 is a diagram showing an example of a configuration of a semiconductor storage device 1000 which includes a readout circuit 100 according to an embodiment.

FIG. 1 is a diagram showing an example of a configuration of a semiconductor storage device 1000 which includes a readout circuit 100 according to an embodiment.

As shown in FIG. 1, the semiconductor storage device 1000 includes a memory cell MC, a reference cell RC, a first bit line BL1, a second bit line BL2, a first column decoder col1, a second column decoder col2, a readout circuit 100, and a decision circuit 101.

The semiconductor storage device 1000 is, for example, a flash memory (for example, a NOR flash memory, a NAND flash memory, or a low power dissipation flash memory).

The memory cell MC is, for example, a memory cell such as a NAND flash memory or a NOR flash memory. The memory cell MC is adapted to change in threshold voltage according to charge stored in, for example, its floating gate and store data in correspondence with the threshold voltage.

In this case, if, for example, the threshold voltage is higher than a readout voltage VR applied from a word line (not illustrated) to a control gate, the memory cell MC turns off to decrease a cell current Icell. On the other hand, if the threshold voltage is lower than the readout voltage VR applied from the word line (not illustrated) to the control gate, the memory cell MC turns on to increase the cell current Icell.

In other words, if, for example, the threshold voltage is lower than the readout voltage VR, the memory cell MC stores data "0." On the other hand, if the threshold voltage is higher than the readout voltage VR, the memory cell MC stores data "1."

Thus, on/off of the memory cell MC at the time when the readout voltage VR is applied to the control gate depends upon the data stored in the memory cell MC.

In FIG. 1, one memory cell MC in a memory cell array (not illustrated) formed of a plurality of memory cells is shown as an example.

The reference cell RC is, for example, a MOS transistor. A reference current Iref is, for example, a current which flows through the reference cell RC when a predetermined voltage is applied to a gate of the reference cell RC via a word line (not illustrated). The reference current Iref is set to be greater than a middle value between a first cell current Icell(OFF) which flows when the memory cell is in the off-state and a second cell current Icell(ON) which flows when the memory cell is in the on-state and also to be smaller than the second cell current Icell(ON).

If there are a plurality of reference cells RC and a plurality of memory cells MC, then dispersion is generated in the first cell current Icell(OFF), the second cell current Icell(ON), and the reference current Iref, resulting in distributions. Therefore, the reference current Iref is set so as to cause a value obtained by subtracting a maximum value of the first cell current Icell(OFF) from a minimum value of the reference current Iref to becomes greater than a value obtained by subtracting a maximum value of the reference current Iref from a minimum value of the second cell current Icell(ON).

Note that the reference cell RC may have a configuration similar to that of the memory cell MC to reduce influence of PVT characteristics.

One reference cell RC included in a plurality of reference cells is shown in FIG. 1.

The first column decoder coil is adapted to select the memory cell MC and electrically connect the first bit line BL1 which is connected to the selected memory cell MC and through which the cell current Icell flows to the readout circuit 100 (an input of a sense amplifier 1 which will be described later).

The second column decoder col2 is adapted to select the reference cell RC and electrically connect the second bit line BL2 which is connected to the selected reference cell RC and through which the reference current Iref flows to the readout circuit 100 (an input of the sense amplifier 1 which will be described later).

The readout circuit 100 is configured to output a data output signal Dout according to the reference current Iref and the cell current Icell, which changes depending upon whether the memory cell MC is on or off.

The decision circuit 101 is configured to make a decision as to the logic value of data stored in the memory cell MC on the basis of the logic value of the data output signal DOUT during a predetermined interval.

As shown in FIG. 1, the readout circuit 100 includes a sense amplifier 1, a reset circuit 2, a latch circuit 3, a delay circuit 4, and a buffer circuit 5.

The reset circuit 2 is adapted to output a reset signal SARESET for resetting the sense amplifier 1 on the basis of a clock signal CLK.

The delay circuit 4 is adapted to output a delay signal gin obtained by delaying the clock signal CLK, on the basis of the clock signal CLK. The delay circuit 4 includes, for example, a plurality of (an odd number of) inverters 4a, 4b and 4c connected in series between an input side supplied with the clock signal CLK and an output side from which the delay signal gin is output.

The sense amplifier 1 is configured to compare the cell current Icell to the reference current Iref and output a comparison signal SAOUT that depends upon a result of the comparison.

In other words, upon detecting that the cell current Icell is smaller than the reference current Iref, the sense amplifier 1 outputs the comparison signal SAOUT of a first logic (for example, a "Low" level, i.e., data "0"). On the other hand, upon detecting that the cell current Icell is greater than the reference current Iref, the sense amplifier 1 outputs the comparison signal SAOUT of a second logic (for example, a "High" level, i.e., data "1").

In addition, upon being reset by the reset signal SARESET, the sense amplifier 1 outputs the comparison signal SAOUT of the second logic.

The latch circuit 3 is configured to latch the logic of the comparison signal SAOUT and output a first digital signal /DOUT which depends upon the latched logic. Furthermore, the latch circuit 3 is configured to be reset by the delay signal gin.

The first NAND circuit 3a is connected at its inputs to a set terminal S and an output of the second NAND circuit 3b, and connected at its output to an output terminal Q. The first NAND circuit 3a is configured to be supplied with the comparison signal SAOUT and a second digital signal qout as its inputs and output a first digital signal /DOUT.

The second NAND circuit 3b is connected at its inputs to a reset terminal R and the output of the first NAND circuit 3a, and connected at its output to an input of the first NAND circuit 3a. The second NAND circuit 3b is configured to be supplied with the delay signal gin and the first digital signal /DOUT as its inputs and output the second digital signal qout to the first NAND circuit 3a.

The buffer circuit 5 is adapted to be supplied at its input with the first digital signal /DOUT which is output from the output terminal Q of the latch circuit 3 and output a data output signal DOUT according to the first digital signal /DOUT.

As shown in FIG. 1, the buffer circuit 5 is, for example, an inverter, and the data output signal DOUT is a signal obtained by inverting the logic of the first digital signal /DOUT.

Figure 2:
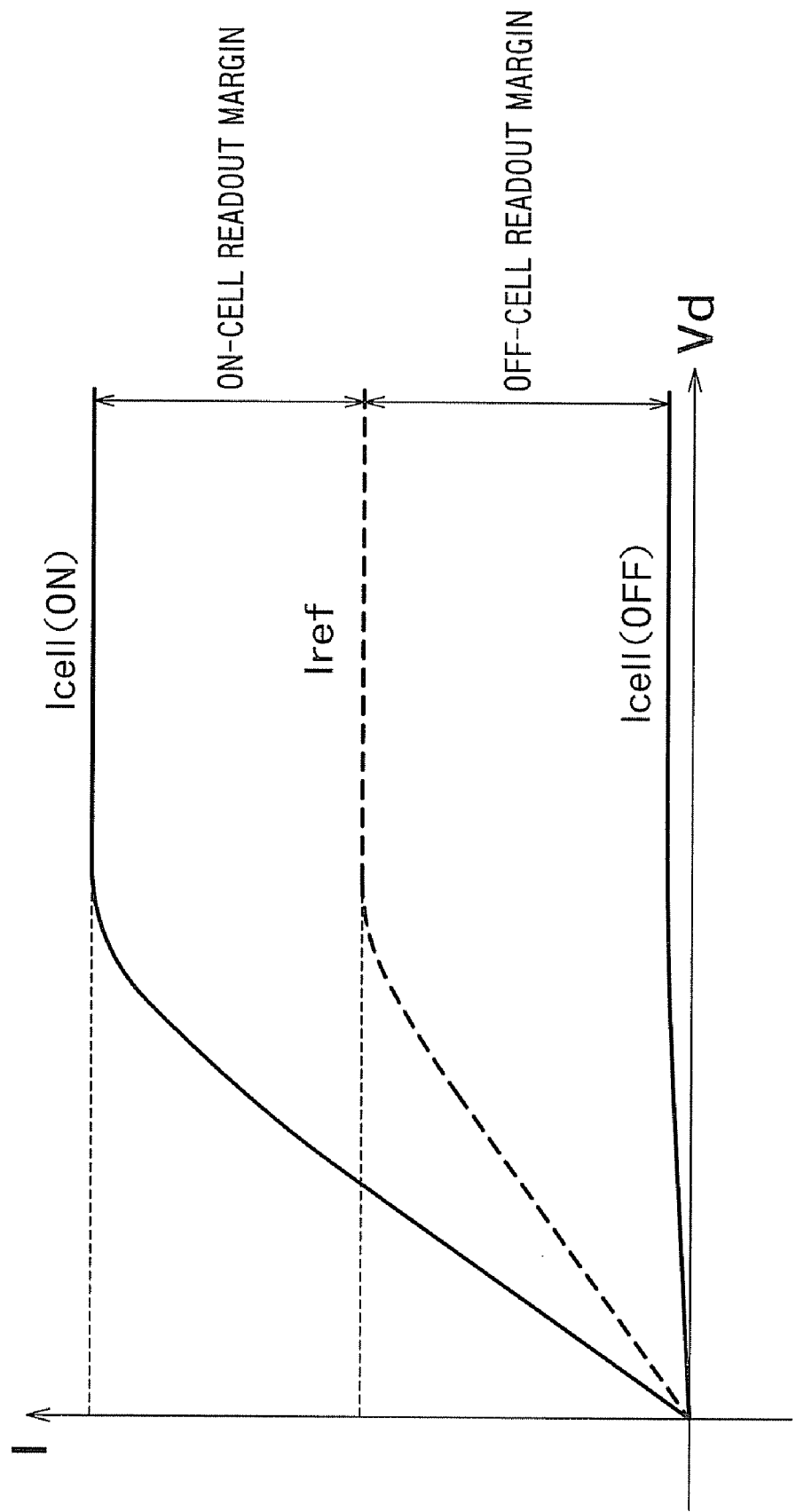
FIG. 2 is a diagram showing an example of a relation between the cell current Icell and the reference current Iref in a comparative example.
Figure 3:
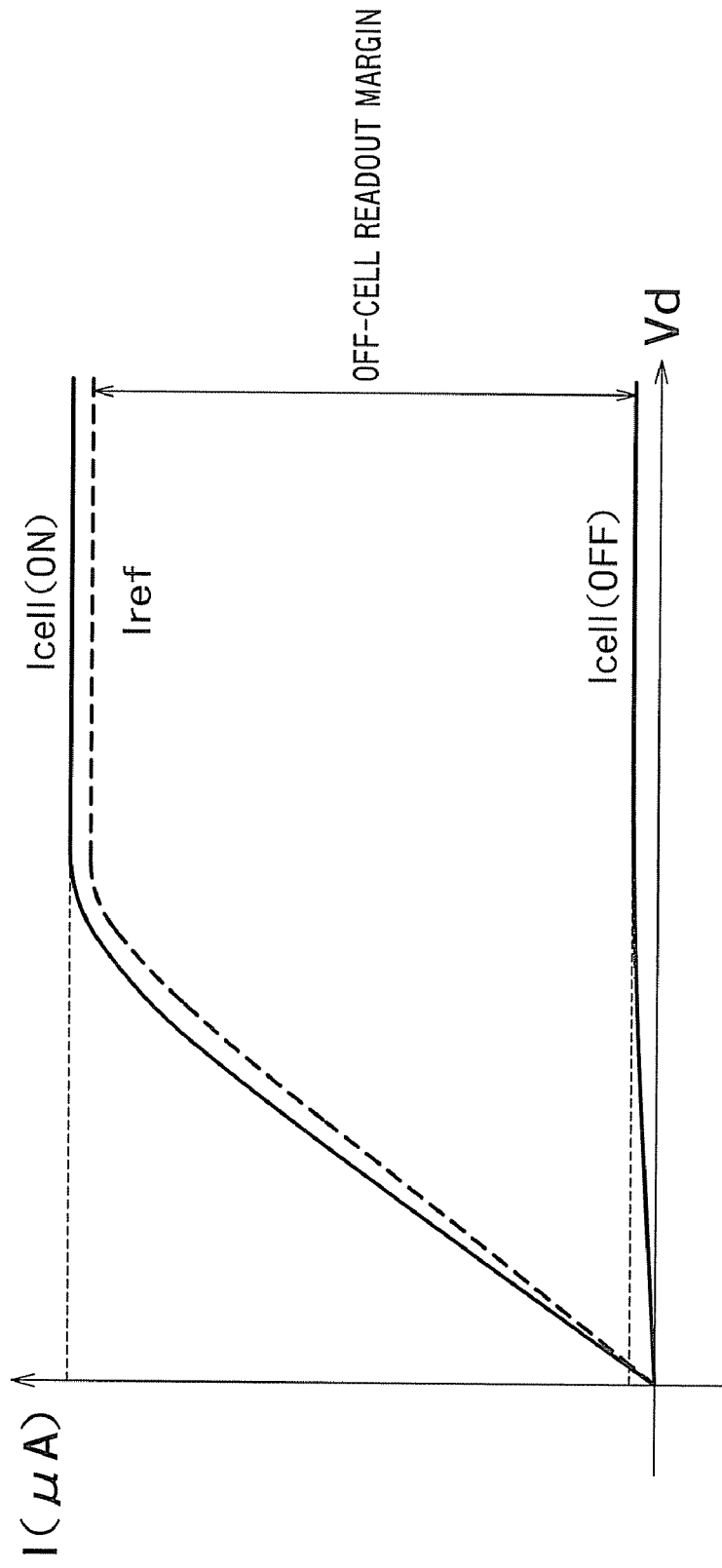
FIG. 3 is a diagram showing an example of a relation between the cell current Icell and the reference current Iref in the semiconductor storage device 1000 shown in FIG. 1.

FIG. 2 is a diagram showing an example of a relation between the cell current Icell and the reference current Iref in a comparative example. FIG. 3 is a diagram showing an example of a relation between the cell current Icell and the reference current Iref in the semiconductor storage device 1000 shown in FIG. 1. In FIGS. 2 and 3, the ordinate axis indicates a current I which flows through the memory cell MC and the reference cell RC, and the abscissa axis indicates a drain voltage Vd of the memory cell MC and the reference cell RC.

As shown in FIG. 2, in the comparative example (conventional art), the reference current Iref is set equal to the middle value between the first cell current Icell(OFF) which flows when the memory cell is in the off-state and the second cell current Icell(ON) which flows when the memory cell is in the on-state as described above.

In other words, the margin for the sense amplifier to read out data from the memory cell MC which is in the on-state is equal to the margin for the sense amplifier to read out data from the memory cell MC which is in the off-state. In this comparative example, it becomes difficult to secure the margin of the readout operation of the sense amplifier 1 if the cell current at the time when the memory cell MC is on becomes small, as described above.

On the other hand, in the present embodiment, the reference current Iref is set to be greater than the middle value between the first cell current Icell(OFF) which flows when the memory cell is in the off-state and the second cell current Icell(ON) which flows when the memory cell is in the on-state and also to be smaller than the second cell current Icell(ON) as shown in FIG. 3.

In other words, in the present embodiment, the margin for the sense amplifier 1 to read out data from the memory cell which is in the off-state is expanded in comparison with the comparative example. If the sense amplifier 1 is specialized in reading data from the memory cell MC which is in the off-state, therefore, it is facilitated to secure the margin of readout operation of the sense amplifier 1.

Furthermore, when the sense amplifier 1 reads data from the memory cell MC which is in the off-state, for example, an inverter (not illustrated) included in the sense amplifier 1 can be made to operate faster by setting the reference current Iref greater than the middle value. In other words, the comparison and decision conducted by the sense amplifier 1 becomes faster when the memory cell MC is off in comparison with when the memory cell MC is on. In this case, the sense amplifier 1 can be operated faster.

In this case, the margin for the sense amplifier 1 to read out data from the memory cell which is in the on-state is narrowed in comparison with the comparative example. In addition, in this case, the time for comparison and decision in the sense amplifier 1 also becomes longer. In the present embodiment, however, it is supposed that the memory cell MC is in the on-state unless the sense amplifier 1 outputs a comparison result that the memory cell MC is in the off-state as described later. In other words, the narrowing of the margin of the sense amplifier 1 when reading data from the memory cell MC which is in the on-state does not have influence upon the readout of the readout circuit 100.

An example of readout operation of the readout circuit 100 having the configuration described heretofore will now be described separately as to the cases where the memory cell MC is in the off-state, and where the memory cell MC is in the on-state, respectively by applying the readout voltage VR to the gate.

Here, if the cell current Icell is smaller than the reference current Iref (if a decision is made that the cell current Icell is the first cell current Icell(OFF) at the time when the memory cell MC is in the off-state), then the sense amplifier 1 outputs the comparison signal SAOUT of the "Low" level. On the other hand, if the cell current Icell is greater than the reference current Iref (if a decision is made that the cell current Icell is the second cell current Icell(ON) at the time when the memory cell MC is in the on-state), then the sense amplifier 1 outputs the comparison signal SAOUT of the "High" level.

Furthermore, it is supposed that in the case where the sense amplifier is reset by the reset signal SARESET of a "High" level the sense amplifier 1 outputs the comparison signal SAOUT of the "High" level in the same way as the case where the cell current Icell is greater than the reference current Iref.

Figure 4:
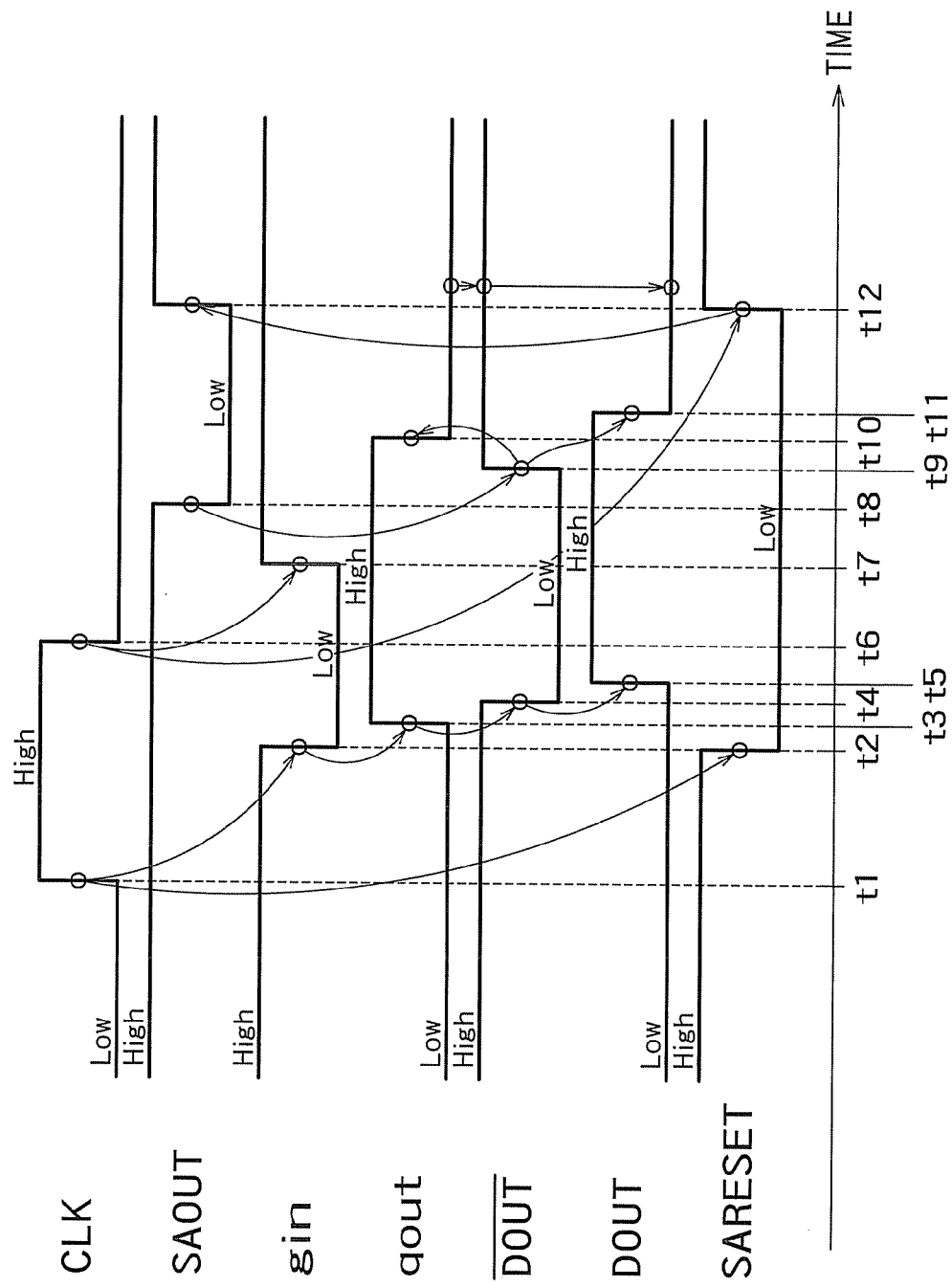
FIG. 4 is a timing chart showing an example of readout operation of the readout circuit 100 shown in FIG. 1 at the time when the memory cell MC is in the off-state.

FIG. 4 is a timing chart showing an example of readout operation of the readout circuit 100 shown in FIG. 1 at the time when the memory cell MC is in the off-state.

As shown in FIG. 4, in the initial state, the reset signal SARESET is at the "High" level, and consequently the sense amplifier 1 is reset and the comparison signal SAOUT is at the "High" level. Furthermore, since the clock signal CLK is at the "Low" level, the delay signal gin is at the "High" level. Therefore, the second digital signal qout is at the "Low" level.

In other words, in the initial state, the first digital signal /DOUT is at the "High" level and the data output signal DOUT is at the "Low" level.

Then, at time t1, the clock signal CLK becomes the "High" level. As a result, at time t2, the delay circuit 4 brings the delay signal gin to the "Low" level and the reset circuit 2 brings the reset signal SARESET to the "Low" level.

And at time t3, the second NAND circuit 3b brings the second digital signal qout to the "High" level in response to the change of the delay signal gin to the "Low" level.

And at time t4, the first NAND circuit 3a brings the first digital signal /DOUT to the "Low" level in response to the change of the second digital signal qout to the "High" level.

And at time t5, the buffer circuit 5 brings the data output signal DOUT to the "High" level in response to the change of the first digital signal /DOUT to the "Low" level.

Thus, the logic of the latch circuit 3 is reset, and the sense amplifier 1 is brought into a state in which sense operation is possible. Note that, since the second digital signal qout is at the "High" level at this time, the first digital signal /DOUT which is output by the latch circuit 3 can be changed according to the comparison signal SAOUT.

Then, at time t6, the clock signal CLK becomes the "Low" level. As a result, the delay circuit 4 brings the delay signal gin to the "High" level at time t7.

As a result, a state in which the first digital signal /DOUT changes according to the comparison signal SAOUT and the second digital signal qout changes according to the first digital signal /DOUT is brought about. In other words, a state in which the latch operation of the latch circuit 3 is controlled according to the comparison signal SAOUT is brought about.

In the example shown in FIG. 4, the memory cell MC turns off and the first cell current Icell(OFF) flows as described above. At later time t8, therefore, the sense amplifier 1 compares the cell current Icell (the first cell current Icell(OFF)) with the reference current Iref. Upon detecting that the cell current Icell is smaller than the reference current Iref, the sense amplifier 1 outputs the comparison signal SAOUT of the "Low" level of the first logic.

And at time t9, the first NAND circuit 3a brings the first digital signal /DOUT to the "High" level in response to the change of the comparison signal SAOUT to the "Low" level.

And at time t10, the second NAND circuit 3b brings the second digital signal qout to the "Low" level in response to the change of the first digital signal /DOUT to the "High" level.

As a result, the latch circuit 3 latches and outputs the logic (at the "High" level) of the first digital signal /DOUT depending upon the first logic of the comparison signal SAOUT.

And at time t11, the buffer circuit 5 brings the data output signal DOUT to the "Low" level in response to the change of the first digital signal /DOUT to the "High" level.

And at time t12, the reset circuit 2 brings the reset signal SARESET to the "High" level in response to the change of the clock signal CLK to the "Low" level. As a result, the sense amplifier 1 is reset and the sense amplifier 1 outputs the comparison signal SAOUT of the "High" level regardless of a result of comparison made between the cell current Icell and the reference current Iref.

Furthermore, since the delay signal gin which resets the latch circuit 3 remains at the "High" level, the first digital signal /DOUT is kept at the "High" level and the second digital signal qout is kept at the "Low" level.

In other words, over a period from the time t12 to the next input (rising) of the clock signal CLK, the data output signal DOUT is kept at the "Low" level regardless of the result of the comparison made between the cell current Icell and the reference current Iref.

Note that the next resetting of the latch circuit 3 is executed by the next rising of the clock signal CLK. In other words, a period between resetting of the sense amplifier 1 and the next resetting of the latch circuit 3 becomes a readout period over which data stored in the memory cell MC can be read out.

After the time t12, the sense amplifier 1 is reset and the comparison signal SAOUT is fixed. Therefore, even if the cell current Icell which is input to the sense amplifier 1 changes, the readout circuit 100 can output the data output signal DOUT more stably.

The decision circuit 101 makes a decision as to the logic of data stored in the memory cell MC on the basis of the data output signal DOUT over a period from the time t12 (after the sense amplifier 1 is reset) to next input (rising) of the clock signal CLK.

In other words, the decision circuit 101 judges that the memory cell MC is in the off-state (i.e., the memory cell MC has data "0" stored therein) with respect to application of the readout voltage VR to the gate, on the basis of the "Low" level of the data output signal DOUT.

And the decision circuit 101 outputs, for example, a signal indicating data "0" to an external circuit (not illustrated) or the like.

Figure 5:
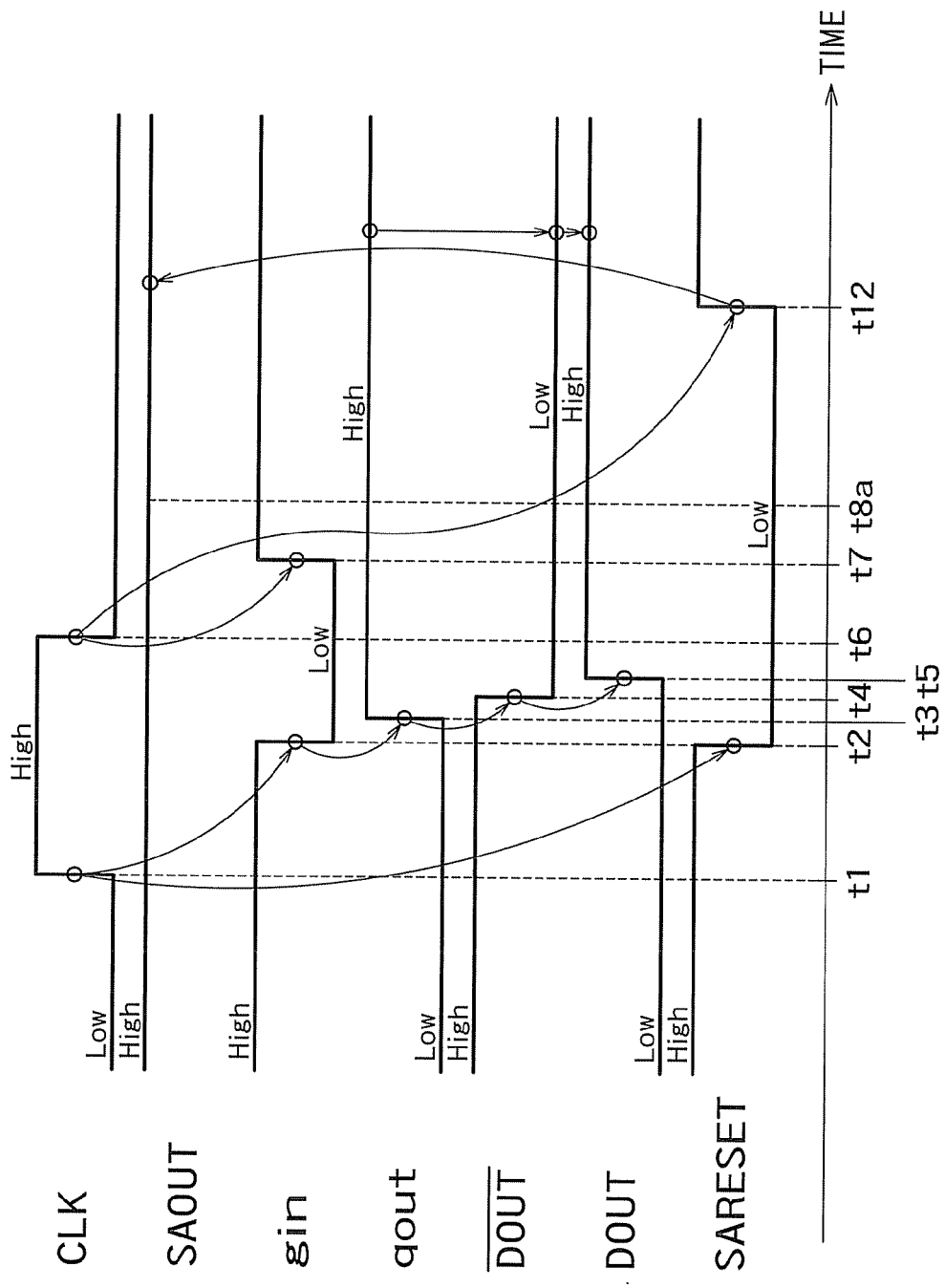
FIG. 5 is a timing chart showing an example of readout operation of the readout circuit 100 shown in FIG. 1 at the time when the memory cell MC is in the on-state.

On the other hand, FIG. 5 is a timing chart showing an example of readout operation of the readout circuit 100 shown in FIG. 1 at the time when the memory cell MC is in the on-state. Note that operation conducted until time t7 shown in FIG. 5 is similar to the operation conducted until the time t7 shown in FIG. 4.

As shown in FIG. 5, in the initial state, the reset signal SARESET is at the "High" level, and consequently the sense amplifier 1 is reset and the comparison signal SAOUT is at the "High" level. Furthermore, since the clock signal CLK is at the "Low" level, the delay signal gin is at the "High" level. Therefore, the second digital signal qout is at the "Low" level.

In other words, in the initial state, the first digital signal /DOUT is at the "High" level and the data output signal DOUT is at the "Low" level.

Then, at time t1, the clock signal CLK becomes the "High" level. As a result, at time t2, the delay circuit 4 brings the delay signal gin to the "Low" level and the reset circuit 2 brings the reset signal SARESET to the "Low" level.

And at time t3, the second NAND circuit 3b brings the second digital signal qout to the "High" level in response to the change of the delay signal gin to the "Low" level.

And at time t4, the first NAND circuit 3a brings the first digital signal /DOUT to the "Low" level in response to the change of the second digital signal qout to the "High" level.

And at time t5, the buffer circuit 5 brings the data output signal DOUT to the "High" level in response to the change of the first digital signal /DOUT to the "Low" level.

Thus, the logic of the latch circuit 3 is reset, and the sense amplifier 1 is brought into a state in which sense operation is possible. Note that since the second digital signal qout is at the "High" level at this time, the first digital signal /DOUT which is output by the latch circuit 3 can be changed according to the comparison signal SAOUT.

Then, at time t6, the clock signal CLK becomes the "Low" level. As a result, the delay circuit 4 brings the delay signal gin to the "High" level at time t7.

As a result, a state in which the first digital signal /DOUT changes according to the comparison signal SAOUT and the second digital signal qout changes according to the first digital signal /DOUT is brought about. In other words, a state in which the latch operation of the latch circuit 3 is controlled according to the comparison signal SAOUT is brought about.

As described above, operation of the readout circuit 100 shown in FIG. 5 described heretofore is similar to the operation shown in FIG. 4.

In the example shown in FIG. 5, the memory cell MC turns on and the second cell current Icell(ON) flows as described above. Therefore, at later time t8a, the sense amplifier 1 compares the cell current Icell (the second cell current Icell (ON)) with the reference current Iref. Upon detecting that the cell current Icell is greater than the reference current Iref, the sense amplifier 1 outputs the comparison signal SAOUT of the "High" level of the second logic. In other words, the comparison signal SAOUT is kept at the "High" level.

And at time t12, the reset circuit 2 brings the reset signal SARESET to the "High" level in response to the change of the clock signal CLK to the "Low" level. As a result, the sense amplifier 1 is reset and the sense amplifier 1 outputs the comparison signal SAOUT of the "High" level regardless of a result of comparison made between the cell current Icell and the reference current Iref. In other words, the comparison signal SAOUT is kept at the "High" level.

As a result, the latch circuit 3 latches and outputs the logic (at the "Low" level) of the first digital signal /DOUT depending upon the second logic of the comparison signal SAOUT.

Furthermore, since the delay signal gin which resets the latch circuit 3 remains at the "High" level, the first digital signal /DOUT is kept at the "Low" level and the second digital signal qout is kept at the "High" level.

In other words, over a period from the time t12 to the next input (rising) of the clock signal CLK, the data output signal DOUT is kept at the "High" level regardless of the result of the comparison made between the cell current Icell and the reference current Iref.

Note that the next resetting of the latch circuit 3 is executed by the next rising of the clock signal CLK. In other words, a period between resetting of the sense amplifier 1 and the next resetting of the latch circuit 3 becomes a readout period over which data stored in the memory cell MC can be read out.

After the time t12, the sense amplifier 1 is reset and the comparison signal SAOUT is fixed. Even if the cell current Icell which is input to the sense amplifier 1 changes, therefore, the readout circuit 100 can output the data output signal DOUT more stably.

As described above, the decision circuit 101 makes a decision as to the logic of data stored in the memory cell MC on the basis of the data output signal DOUT over a period from the time t12 (after the sense amplifier 1 is reset) to next input (rising) of the clock signal CLK.

In other words, the decision circuit 101 judges that the memory cell MC is in the on-state (i.e., the memory cell MC has data "1" stored therein) with respect to application of the readout voltage VR to the gate, on the basis of the "High" level of the data output signal DOUT.

And the decision circuit 101 outputs, for example, a signal indicating data "1" to the external circuit (not illustrated) or the like.

As described heretofore, the readout operation of the sense amplifier 1 is specialized in readout of data from the memory cell MC which is in the off-state. Therefore, the reference current Iref can be raised up to the vicinity of the second cell current Icell(ON) as shown in FIG. 3 described above. In other words, the margin in readout from the memory cell MC conducted by the readout circuit 100 can be expanded.

As already described, the readout circuit 100 conducts the latch operation on the basis of the result of the output from the sense amplifier 1. Therefore, influence upon the time required for the semiconductor storage device 100 to access the data is slight.

According to the readout circuit in the present embodiment, the readout margin of the memory cell can be expanded as described heretofore.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A readout circuit comprising a sense amplifier to compare a cell current, which changes according to whether a memory cell is on or off, to a reference current to output a comparison signal of a first logic value upon detecting that the cell current is smaller than the reference current, and to output a comparison signal of a second logic value upon detecting that the cell current is greater than the reference current, the readout circuit outputting a data output signal depending upon an output of the sense amplifier, wherein the reference current is set to be greater than a middle value between a first cell current, which flows when the memory cell is in an off-state, and a second cell current, which flows when the memory cell is in an on-state, the reference current is greater than the first cell current and is smaller than the second cell current, and the sense amplifier outputs the comparison signal of the second logic value unless the sense amplifier detects that the cell current is smaller than the reference current as a result of a comparison made between the cell current and the reference current, wherein the sense amplifier outputs the comparison signal of the second logic value regardless of whether the sense amplifier detects that the cell current is greater than the reference current.

2. The readout circuit according to claim 1, comprising:
a reset circuit which outputs a reset signal on the basis of a clock signal;
a delay circuit which outputs a delay signal obtained by delaying the clock signal; and
a latch circuit which latches a logic of the comparison signal output from the sense amplifier and outputs a first digital signal depending upon the latched logic, and which is reset by the delay signal,
wherein,
if the memory cell is off and the first cell current flows, then the sense amplifier outputs the comparison signal of the first logic as a result of the comparison made between the first cell current and the reference current, the latch circuit latches and outputs the first digital signal depending upon the first logic of the comparison signal, then the sense amplifier is reset by the reset signal, and the readout circuit outputs the data output signal on the basis of the first digital signal, and
on the other hand, if the memory cell is on and the second cell current flows, then the sense amplifier outputs the comparison signal of the second logic as a result of the comparison made between the second cell current and the reference current, then the sense amplifier is reset by the reset signal and the sense amplifier outputs the comparison signal of the second logic, then the latch circuit latches and outputs the first digital signal depending upon the second logic of the comparison signal, and the readout circuit outputs the data output signal on the basis of the first digital signal.

3. The readout circuit according to claim 1, wherein the logic of data stored in the memory cell is decided on the basis of the logic of the data output signal.

4. The readout circuit according to claim 2, wherein the logic of data stored in the memory cell is decided on the basis of the logic of the data output signal.

5. The readout circuit according to claim 1, wherein on/off of the memory cell at the time when the readout voltage is applied to the control gate depends upon the data stored in the memory cell.

6. The readout circuit according to claim 2, wherein on/off of the memory cell at the time when the readout voltage is applied to the control gate depends upon the data stored in the memory cell.

7. The readout circuit according to claim 3, wherein on/off of the memory cell at the time when the readout voltage is applied to the control gate depends upon the data stored in the memory cell.

8. The readout circuit according to claim 4, wherein on/off of the memory cell at the time when the readout voltage is applied to the control gate depends upon the data stored in the memory cell.

9. The readout circuit according to claim 2, wherein the latch circuit comprising:
a first NAND circuit is supplied with the comparison signal and a second digital signal, and outputs a first digital signal; and
a second NAND circuit is supplied with the delay signal and the first digital signal, outputs the second digital signal to the first NAND circuit.

10. The readout circuit according to claim 4, wherein the latch circuit comprising:
a first NAND circuit is supplied with the comparison signal and a second digital signal, and outputs a first digital signal; and
a second NAND circuit is supplied with the delay signal and the first digital signal, outputs the second digital signal to the first NAND circuit.

11. The readout circuit according to claim 6, wherein the latch circuit comprising:
a first NAND circuit is supplied with the comparison signal and a second digital signal, and outputs a first digital signal; and
a second NAND circuit is supplied with the delay signal and the first digital signal, outputs the second digital signal to the first NAND circuit.

12. The readout circuit according to claim 8, wherein the latch circuit comprising:
a first NAND circuit is supplied with the comparison signal and a second digital signal, and outputs a first digital signal; and
a second NAND circuit is supplied with the delay signal and the first digital signal, outputs the second digital signal to the first NAND circuit.

13. The readout circuit according to claim 1, wherein the memory cell is adapted to store data in correspondence with a threshold voltage,
if the threshold voltage is higher than a readout voltage applied to a control gate, the memory cell decreases a cell current, and
if the threshold voltage is lower than the readout voltage applied to the control gate, the memory cell increases the cell current.

14. The readout circuit according to claim 2, wherein the memory cell is adapted to store data in correspondence with a threshold voltage,
if the threshold voltage is higher than a readout voltage applied to a control gate, the memory cell decreases a cell current, and
if the threshold voltage is lower than the readout voltage applied to the control gate, the memory cell increases the cell current.

15. The readout circuit according to claim 3, wherein the memory cell is adapted to store data in correspondence with a threshold voltage, if the threshold voltage is higher than a readout voltage applied to a control gate, the memory cell decreases a cell current, and if the threshold voltage is lower than the readout voltage applied to the control gate, the memory cell increases the cell current.

16. The readout circuit according to claim 4, wherein the memory cell is adapted to store data in correspondence with a threshold voltage, if the threshold voltage is higher than a readout voltage applied to a control gate, the memory cell decreases a cell current, and if the threshold voltage is lower than the readout voltage applied to the control gate, the memory cell increases the cell current.

17. The readout circuit according to claim 1, wherein a reference current is a current which flows through a reference cell when a predetermined voltage is applied to a gate of the reference cell.

18. The readout circuit according to claim 2, wherein a reference current is a current which flows through a reference cell when a predetermined voltage is applied to a gate of the reference cell.

19. A semiconductor storage device comprising:
a memory cell through which a cell current flows, the cell current changes according to whether the memory cell is on or off;
a readout circuit outputting a data output signal depending upon the cell current; and
a decision circuit that is configured to make a decision as to a data stored in the memory cell on the basis of the logic value of the cell current, wherein the readout circuit comprises:
a reset circuit that outputs a reset signal on the basis of a clock signal;
a delay circuit that outputs a delay signal obtained by delaying the clock signal;
a sense amplifier configured to compare the cell current to a reference current, to output a comparison signal of a first logic value upon detecting that the cell current is smaller than the reference current, and to output a comparison signal of a second logic value upon detecting that the cell current is greater than the reference current, and
a latch circuit that latches a logic value of the comparison signal , outputs a first digital signal depending upon the latched logic value, and is reset by the delay signal,
wherein the reference current is set to be greater than a middle value between a first cell current, which flows when the memory cell is in an off-state, and a second cell current, which flows when the memory cell is in an on-state, the reference current is greater than the first cell current and is smaller than the second cell current,
wherein if the memory cell is off and the first cell current flows, then the sense amplifier outputs the comparison signal of the first logic value as a result of the comparison made between the first cell current and the reference current, the latch circuit latches and outputs the first digital signal depending upon the first logic value of the comparison signal, then the sense amplifier is reset by the reset signal, and the readout circuit outputs the data output signal on the basis of the first digital signal, and
on the other hand, if the memory cell is on and the second cell current flows, then the sense amplifier outputs the comparison signal of the second logic value as a result of the comparison made between the second cell current and the reference current, then the sense amplifier is reset by the reset signal and the sense amplifier outputs the comparison signal of the second logic value, then the latch circuit latches and outputs the first digital signal depending upon the second logic value of the comparison signal, and the readout circuit outputs the data output signal on the basis of the first digital signal,
wherein the decision circuit makes a decision as to the logic of data stored in the memory cell on the basis of the data output signal output from the readout circuit after the sense amplifier is reset.

20. A semiconductor storage device comprising:
a memory cell through which a cell current flows, the second current changed according to whether the memory cell is on or off;
a reference cell through which a reference current flows;
a readout circuit outputting a data output signal depending upon the cell current; and
a decision circuit which is adapted to make a decision as to a data stored in the memory cell on the basis of the logic of the cell current,
wherein the readout circuit comprises a sense amplifier configured to compare a cell current which changes according to whether a memory cell is on or off to a reference current, to output a comparison signal of a first logic value upon detecting that the cell current is smaller than the reference current, and to output a comparison signal of a second logic value upon detecting that the cell current is greater than the reference current, the readout circuit outputting a data output signal depending upon an output of the sense amplifier,
the reference current is set to be greater than a middle value between a first cell current, which flows when the memory cell is in an off-state, and a second cell current, which flows when the memory cell is in an on-state, the reference current is greater than the first cell current and is smaller than the second cell current, and
the sense amplifier outputs the comparison signal of the second logic value unless the sense amplifier detects that the cell current is smaller than the reference current as a result of a comparison made between the cell current and the reference current, wherein the sense amplifier outputs the comparison signal of the second logic value regardless of whether the sense amplifier detects that the cell current is greater than the reference current.

* * * * *